(12) United States Patent
Doherty et al.

(10) Patent No.: US 7,091,790 B2
(45) Date of Patent: Aug. 15, 2006

(54) POWER AMPLIFIER (PA) EFFICIENCY WITH LOW CURRENT DC TO DC CONVERTER

(75) Inventors: Mark Doherty, Westford, MA (US); Anthony Quaglietta, North Andover, MA (US); Jose Harrison, North Andover, MA (US)

(73) Assignee: SiGe Semiconductor (U.S.), Corp., Methuen, MA (US)

( * ) Notice: Subject to any disclaimer, the term of this patent is extended or adjusted under 35 U.S.C. 154(b) by 25 days.

(21) Appl. No.: 10/875,234

(22) Filed: Jun. 25, 2004

(65) Prior Publication Data

US 2005/0285681 A1    Dec. 29, 2005

(51) Int. Cl.
*H03F 3/04* (2006.01)
(52) U.S. Cl. .................. 330/297; 330/296; 330/291
(58) Field of Classification Search ............. 330/297, 330/296, 291
See application file for complete search history.

(56) References Cited

U.S. PATENT DOCUMENTS

| | | | |
|---|---|---|---|
| 4,378,530 A * | 3/1983 | Garde | 330/297 |
| 4,736,116 A * | 4/1988 | Pavlak et al. | 307/41 |
| 4,864,214 A * | 9/1989 | Billings et al. | 323/289 |
| 5,949,287 A | 9/1999 | Kurusu et al. | |
| 6,028,485 A | 2/2000 | Sigmon et al. | |
| 6,265,943 B1 | 7/2001 | Dening et al. | |
| 6,624,702 B1 | 9/2003 | Dening | |
| 6,630,867 B1 | 10/2003 | Canyon et al. | |
| 6,646,511 B1 | 11/2003 | Canyon et al. | |
| 2002/0113655 A1 | 8/2002 | Laulzenhiser et al. | |

* cited by examiner

*Primary Examiner*—Patricia Nguyen
(74) *Attorney, Agent, or Firm*—Kenyon & Kenyon LLP

(57) ABSTRACT

A novel method and apparatus is disclosed for reducing power dissipation of RF power amplifiers when a reduced output power level is required. The mechanism has the specific purpose of optimizing the collector terminal voltage on portions of the amplifier's RF chain for maintaining linearity while minimizing power consumption. The apparatus permits a smaller DC to DC converter to be used than in prior art, such that it is implemented in the same semiconductor die or module. Furthermore, the invention eliminates the amplification and phase continuity issues that arise from switched state power amplifiers and envelope-following approaches.

23 Claims, 5 Drawing Sheets

POWER AMPLIFIER (PA) EFFICIENCY WITH LOW CURRENT DC TO DC CONVERTER

FIELD OF THE INVENTION

The invention relates to the field of low current power amplifier consumption and more specifically to the field of low current power amplifier consumption by using a DC to DC voltage conversion circuit.

BACKGROUND OF THE INVENTION

Many people desire a longer operating lifetime for their battery-powered electronic, such as mobile telephones, MP3 players, and so forth. Typically in order for these battery-powered devices to conserve electrical power, their current consumption is managed preferably retaining operating characteristics thereof unaltered over as much of the battery operating range as possible.

Numerous techniques and publications exist, which detail methods and apparatus for improving power amplifier (PA) power consumption by varying supply voltage provided thereto using a DC to DC converter. For example, U.S. Pat. No. 6,624,702, discloses circuitry for controlling of a DC to DC converter in dependence upon sensed RF output signal power for the PA, which enables operation of the PA at high efficiencies as RF output signal power is changed.

Other variants use an envelope tracking power supply coupled with collector terminals of bipolar transistors in combination with a variable base terminal supply current in order to monitor PA power consumption. Unfortunately, envelope tracking requires a complex power supply and has yet to be demonstrated in a practical fashion.

For example, U.S. Pat. Nos. 6,630,867 and 6,646,511 disclose the use of a power management unit in conjunction with a PA in order to monitor the power consumption of the PA and to vary an operating voltage applied to the PA in dependence upon the power consumption.

Unfortunately, the standard approach in using a DC to DC converter requires very large regulator components capable of delivering an output signal current of over 700 mA with a clean output spectrum. In general, the size and conversion efficiency of this regulator type is more problematic at high current due to dropping losses in pass transistors. Thus, using prior art DC to DC converter technology result in high cost and size issues. Additionally, the challenge in using the prior art circuits arises when these circuits are used in current sensitive devices, such as portable electronic devices.

A need therefore exists to provide a power amplifier with improved power consumption efficiency. It is therefore an object of the invention to provide a power amplifier (PA) that utilizes a low current DC to DC converter for operation thereof.

SUMMARY OF THE INVENTION

In accordance with the invention there is provided a power amplifier (PA) circuit comprising: a PA output stage having a first amplifying portion having a first amplification and disposed in parallel with a second amplifying portion having a second amplification portion, the PA output stage having an output stage input port for receiving of a RF input signal, an output stage output port for providing of an amplified RF signal, and an output stage amplification being the amplification from the output stage input port to the output stage output port; at least a biasing circuit for biasing of at least one of the first amplifying portion and the second amplifying portion; a DC to DC converter circuit coupled with the second amplifying portion for providing of a second converted output voltage to the second amplifying portion; a first control port coupled with the DC to DC converter and for receiving a first control signal to control the DC to DC converter second converted output voltage in dependence upon a predetermined signal strength of the amplified RF signal at the output stage output port; and, a second control port coupled with the at least a biasing circuit and for receiving a second control signal to control the at least a biasing circuit in such a manner that a ratio of RF input signal amplification between the first amplification and the second amplification varies in dependence upon the predetermined signal strength at the output stage output port.

In accordance with the invention there is provided a method of controlling PA linearity and power consumption comprising: providing of a PA output stage having a first amplifying portion having a first amplification and a second amplifying portion having a second amplification that is greater than the first amplification, where the first amplification and the second amplification together form an output stage amplification; providing of a DC to DC converted for providing a converted output voltage; receiving of a RF input signal by the PA output stage; determining whether a signal power of the RF input signal is one of below a threshold signal power level and above the threshold signal power level; when the signal power of the RF input signal is below the threshold signal power level: biasing of the first amplifying portion with a low bias voltage; when the signal power of the RF input signal is above the threshold signal power level: biasing of the first amplifying portion with a high bias voltage that is higher than the low bias voltage; biasing of the second amplifying portion using the converted output voltage received from the DC to DC converter; and, amplifying of the RF input signal to form a RF output signal that is an amplified version of the RF input signal.

In accordance with the invention there is provided a power amplifier (PA) comprising: a PA output stage having a first amplifying portion having a first amplification and disposed in parallel with a second amplifying portion having a second amplification, the PA output stage having an output stage input port for receiving of a RF input signal, an output stage output port for providing of an amplified RF signal, and an output stage amplification being the amplification of the RF input signal from the output stage input port to the output stage output port; a DC to DC converter circuit comprising a first control port for receiving a first control signal for controlling the DC to DC converter for providing of a second converted output voltage to the second amplifying portion in dependence upon a predetermined signal strength of the amplified RF signal at the output stage output port; and, at least a biasing circuit for biasing the first amplifying portion in dependence upon the first control signal for amplifying the RF input signal such that for the output stage amplification a ratio between the first amplification and the second amplification varies in dependence upon the first control signal.

BRIEF DESCRIPTION OF THE DRAWINGS

Exemplary embodiments of the invention will now be described in conjunction with the following drawings, in which.

DETAILED DESCRIPTION OF EMBODIMENTS OF THE INVENTION

Figure 1:
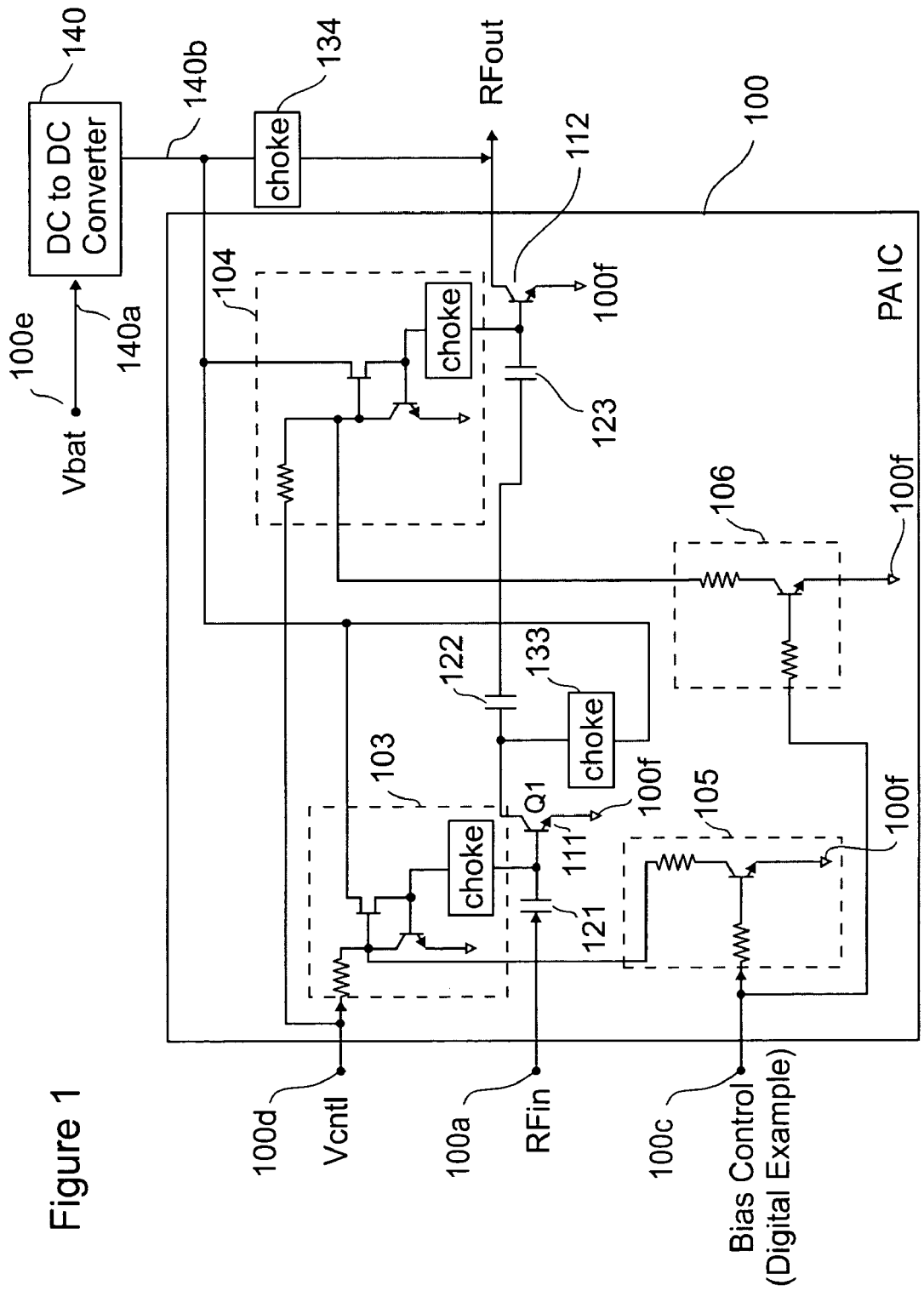
FIG. 1 illustrates a prior art implementation of an external DC to DC converter for reduced power consumption for a two-stage power amplifier integrated circuit (PAIC)

FIG. 1 illustrates a prior art implementation of an external DC to DC converter 140 for providing reduced power consumption for a two-stage power amplifier integrated circuit (PAIC) 100. The two-stage PAIC 100 is comprised of a first stage that includes a first transistor (Q1) 111 and a second amplification stage that includes a second transistor (Q2) 112. Transistors Q1 111 and Q2 112 are capacitively coupled to each other using capacitors 122 and 123, which are disposed in series between the collector terminal of Q1 111 and the base terminal of Q2 112.

A RF input signal is provided to the PAIC 100 through an input port 100a that is capacitively coupled to Q1 111 using capacitor 121. An output port 100b is formed at the collector terminal of Q2 112. A first voltage supply port 100e is coupled with an input port 140a of the DC to DC converter 140 for providing of a positive supply voltage to the DC to DC converter from a voltage supply source and the second supply voltage port 100f is used for receiving of a ground potential, such as from a battery. Emitter terminals of transistors Q1 111 and Q2 112 are coupled to a second supply voltage port 100f, which is a common ground.

The DC to DC converter 140, which is disposed externally to the PAIC 100, has a converted voltage output port 140b for providing a converted output voltage therefrom to circuitry within the PAIC 100. A choke 133 is disposed between the converted voltage output port 140b and the collector terminal of transistor Q1 111 and a choke 134 is disposed between the converted voltage output port 140b and the collector terminal of transistor Q2 112. First and second bias voltage sources, 103 and 104, are coupled to the base terminals of transistors Q1 111 and Q2 112, respectively, for biasing of the base terminal for these transistors. Each bias voltage source, 103 and 104, is provided with an enable port 100d that optionally functions as a voltage reference port.

A bias control port 100c is coupled with a first shunting circuit 105 and with a second shunting circuit 106. The first shunting circuit 105 is coupled to the base terminal of transistor Q1 111 for altering a base terminal bias for transistor Q1 111 in response to a bias signal that is applied to the bias control port 100c. The second shunting circuit 105 is coupled to the base terminal of transistor Q2 112 for altering the base terminal bias for transistor Q2 111 in response to the bias control signal that is applied to the bias control port 100c. The bias control signal is either a digital or analog signal. In the case when the bias control signal is in the form of a digital signal it provides discrete levels of bias and resulting RF signal amplification while if the bias control signal is in the form of an analog bias signal it provides a continuously variable level of amplification.

Typically, it is a characteristic of RF transistors, Q1 111 and Q2 112, when used with complex modulation schemes, to maintain linearity at increasingly higher RF output signal power levels for increased bias currents provided thereto. Conversely, for bias currents that are too low, RF output signal linearity decreases with increasing RF input signal power.

Unfortunately, for the prior art PAIC 100, the external DC to DC converter 140 is not integrated within the same die as the PAIC 100 and is thus included as a standalone component. Furthermore, because the external DC to DC converter 140 is coupled to transistors Q1 111 and Q2 112 for providing of collector terminal voltage thereto, it utilizes large internal regulator components for providing over 700 mA of current from the converted voltage output port 140b. Additionally, the size of this DC to DC converter 140 and conversion efficiency thereof are problematic at high voltage conversion currents due to the dropping losses in the use of pass transistors that form the circuitry therein. The use of the external DC to DC converter 140 in conjunction with the PAIC 100 results in high cost and size issues, and is thus non advantageous. Furthermore, because the DC to DC converted 140 is a large device, it does not facilitate integration onto a same semiconductor substrate as the PAIC 100.

Figure 2A:
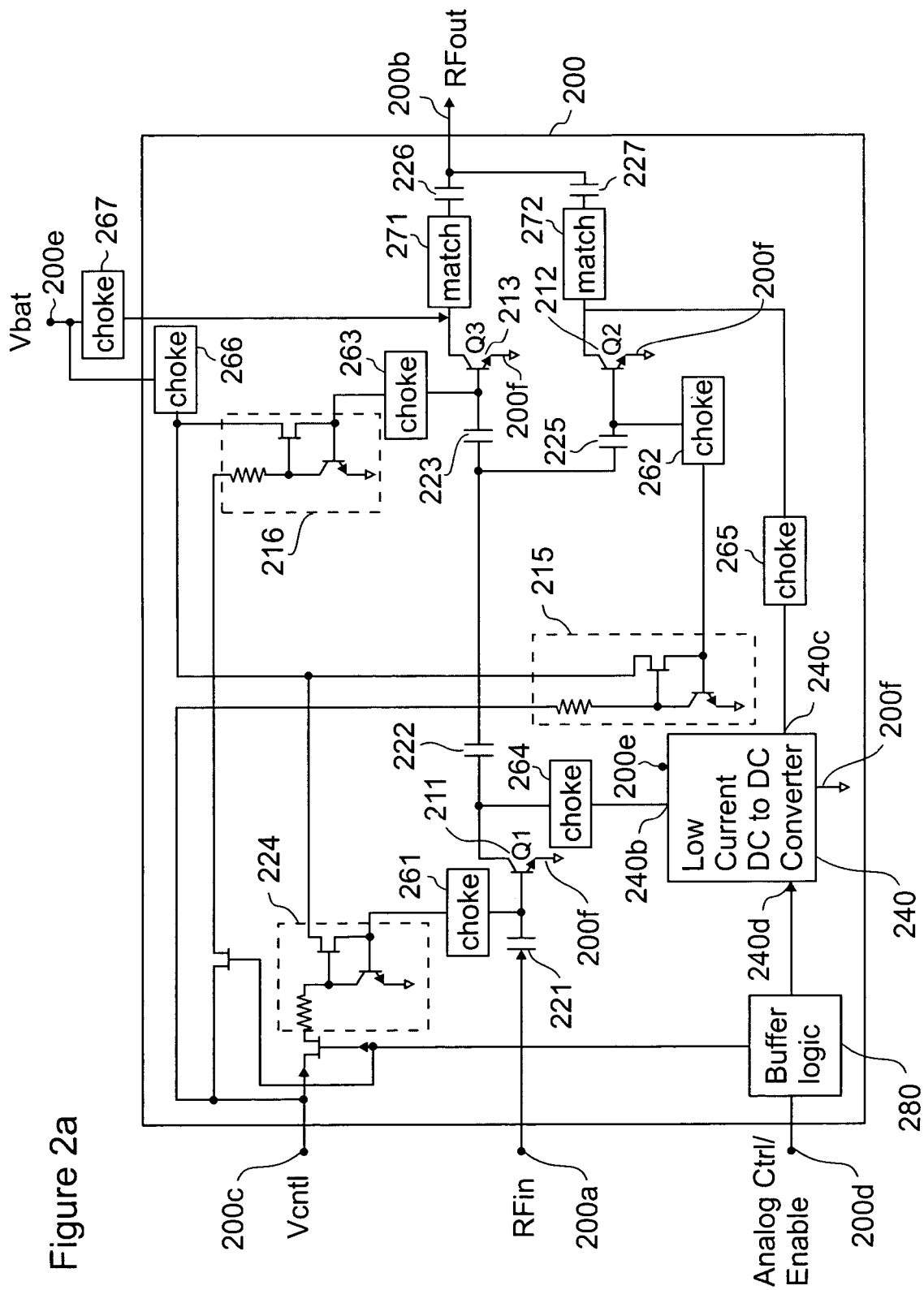
FIG. 2a illustrates a two-stage power amplifier integrated circuit (PAIC), which includes a low current DC to DC converter and analog bias control, in accordance with a first embodiment of the invention.

FIG. 2a illustrates a two-stage power amplifier integrated circuit (PAIC) 200, which includes a low current DC to DC converter 240, which is integrated as part of the PAIC 200, and analog bias control, in accordance with a first embodiment of the invention. An input stage of the two-stage amplifier circuit is comprised of a first transistor (Q1) 211. An output amplification stage of the two-stage, or multi-stage, amplifier having an output stage amplification is comprised of a first amplifying portion having a first amplification and including a third transistor (Q3) 213 and a second amplifying portion having a second amplification and including a second transistor Q2 212. The first amplification and the second amplification together form the output stage amplification.

Transistors Q1 211 and Q3 213 are capacitively coupled to each other using capacitors 222 and 223 disposed in series between the collector terminal of Q1 211 and the base terminal of Q3 213. The base terminal of transistor Q2 212 is capacitively coupled to the collector terminal of transistor Q1 211 using capacitors 222 and 225 disposed in series between these collector and base terminals. Transistor Q2 212 has its collector terminal coupled in series with a first impedance-transforming network 272 and a coupling capacitor 227 to the output port 200b. The collector terminal of transistor Q3 213 has its collector terminal coupled in series with a second impedance-transforming network 271 and a coupling capacitor 226 to the output port 200b. A RF input port 200a of the PAIC 200 is capacitively coupled using capacitor 221 to the base terminal of transistor Q1 211 for capacitive coupling of a RF input signal thereto.

A first supply voltage port 200e is used to supply a positive voltage from a voltage supply source, such as a battery, to the PAIC 200, where the input amplification stage is disposed between the first supply voltage port 200e and a second supply voltage port 200f, which is coupled to ground. The low current DC to DC converter 240 is also disposed between the first and second supply voltage ports, 200e and 200f, having its positive voltage input ports, 240a coupled with the first supply voltage port 200e. A second control port

200*d* that operates as an analog control port or as an enable port is also provided as part of the DC to DC converter 240 for enabling and disabling operation thereof as well as for controlling or enabling operation of bias circuits, 214, 215 and 216 as well as for providing continuous control of first and second converted output voltages that are provided from first and second converted output voltage output ports, 240*b* and 240*c*. A buffer circuit 280 is disposed between the second control port 200*d* and a DC to DC converter control port 240*d* and the biasing circuits 214, 215 and 216.

The first converted voltage output port 240*b* is coupled using a choke 264 to the collector terminal of transistor Q1 211. A second converted voltage output port 240*c* is coupled using a choke 265 to the collector terminal of transistor Q2 212. The collector terminal of transistor Q3 213, which forms the output port 200*b*, is additionally coupled using a choke 267 to the first supply voltage port 200*e*. A choke 266 is also disposed for coupling of the bias circuits 214, 215, and 216 to the first supply voltage port 200*e*.

A first bias voltage source 214 is coupled to the base terminal of transistor Q1 211 using a choke 261, a second bias voltage source 215 is coupled to the base terminal of transistor Q2 212 using a choke 262 and a third bias voltage source 216 is coupled to the base terminal of transistor Q3 213 using a choke 263. The bias voltage sources, 214, 215 and 216, are all coupled with a first control port 200*c* for receiving of a first control signal, in the form of an external control signal, for controlling the biasing of the transistors 211, 212 and 213, where these circuits are enabled and disabled using an external logic network.

Advantageously, the first embodiment of the invention improves upon the prior art PAIC 100, shown in FIG. 1, by separating the output stage of the PAIC 200 into two separate stages that are capacitively coupled together but utilize different bias circuits, 215 and 216. Preferably, transistor Q3 213 is 3 to 8 times the size of transistor Q2 212.

Transistors Q1 211 and Q2 212 have their collector terminals DC coupled for receiving a low current, first converted supply voltage and second converted supply voltage, which is respectively provided from the first and second converted voltage output ports, 240*b* and 240*c*. The bias voltage sources, 214, 215 and 216 are either controlled using analog control or digital control. The first converted supply voltage and second converted supply voltages are typically low current, and providing less than 150 mA.

Figure 2B:
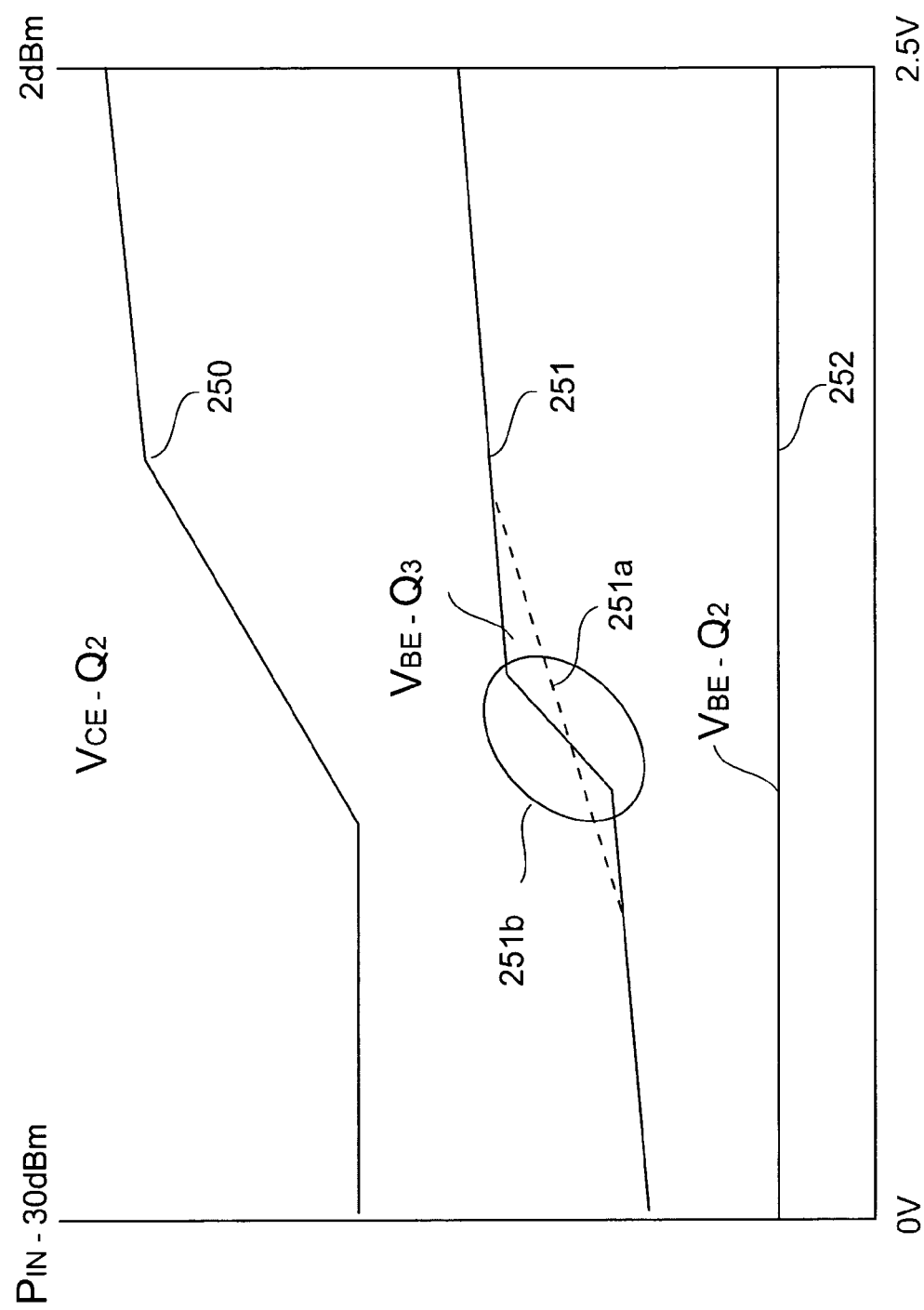
FIG. 2b illustrates a graph showing the operation of the two stage PAIC in accordance to with a first embodiment of the invention.

Referring to FIG. 2*b*, the operation of the PAIC 200 is illustrated for input power ranging from −30 dBm to 2 dBm in relation to the first control signal, which in this example varies from 0V to 2.5V, which is applied to the first control port 200*c*. For low level RF output signal powers, transistors Q1 211 and Q2 212 have nominal base terminal bias conditions sufficient to maintain linearity up to a predetermined RF output signal power level, which is usually no more than $\frac{1}{6}^{th}$ to $\frac{1}{4}^{th}$ of the total RF output signal power for the PAIC 200. Since the collector terminals of transistors Q1 211 and Q2 212 are coupled to the converted voltage output ports, 240*b* and 240*c*, as the first and second converted output voltages increase, the RF output signal power capability provided from the output port 200*b* increases. Only the second converted output voltage is shown as trace 250, where in response to at least one of the first control signal and the second control signal, the DC to DC converter 240 provides an increased second converted output voltage in response to the at least one of the first control signal and the second control signal increasing. Trace 252 illustrates the base emitter terminal biasing for transistor Q2 212. Trace 251 illustrates the base emitter terminal biasing for transistor Q3 213.

Initially, for low RF input signal power, transistor Q3 213 within the first amplifying portion is biased with a low base emitter voltage, which results in approximately minimal current propagating through this transistor and thus provides reduced power consumption to the PAIC 200 where a majority of the amplification for the PAIC 200 is attributed to the second amplifying portion that includes transistor Q2 212. At these low RF output signal powers, transistor Q3 213 is set to have a relatively low quiesent current and thus this transistor does not significantly contribute to the power consumption of the PAIC 200 and thus the efficiency of the PAIC 200 is high. The second amplifying portion is also provided with the second converted output voltage that has a potential that is sufficient for providing a specific linearity for the PAIC 200. As the input signal power increases, the bias current that is provided to the first amplifying portion, which includes transistor Q3 213, is increased and within a switching region 251*b* the first amplifying portion begins to operate. Within this switching region 251*b* the first amplifying portion begins to contribute its first amplification to the output signal. As the at least one of the first control signal and the second control signal is increasing, the first amplifying portion provides increased first amplification to the output signal. Within the switching region 251*b*, the slope of this transition 251*a* is dependent upon the application with which the PAIC 200 is utilized. The first amplifying portion has a static collector voltage and therefore a static linearity as determined by a potential of a battery (not shown) that is connected to the first and second supply voltage ports, 200*e* and 200*f*, respectively.

Alternately, as the converted output voltage increases, the linearity for any level of drive power increases, up to predetermined limits. In use, the increase in RF output signal power is attributed to increases in RF input signal power, by using at least a first control signal and a second control signal provided to the PAIC 200 for providing an increasing voltage to the DC to DC converter 240, which produces a commensurate increase in its first and second converted output voltages. The increased second converted output voltage provides linear operation for the second amplifying portion to a predetermined "switch" point where at this point transistor Q3 213 from the first amplifying portion begins to operate and supplements the RF output signal power.

Figure 2C:
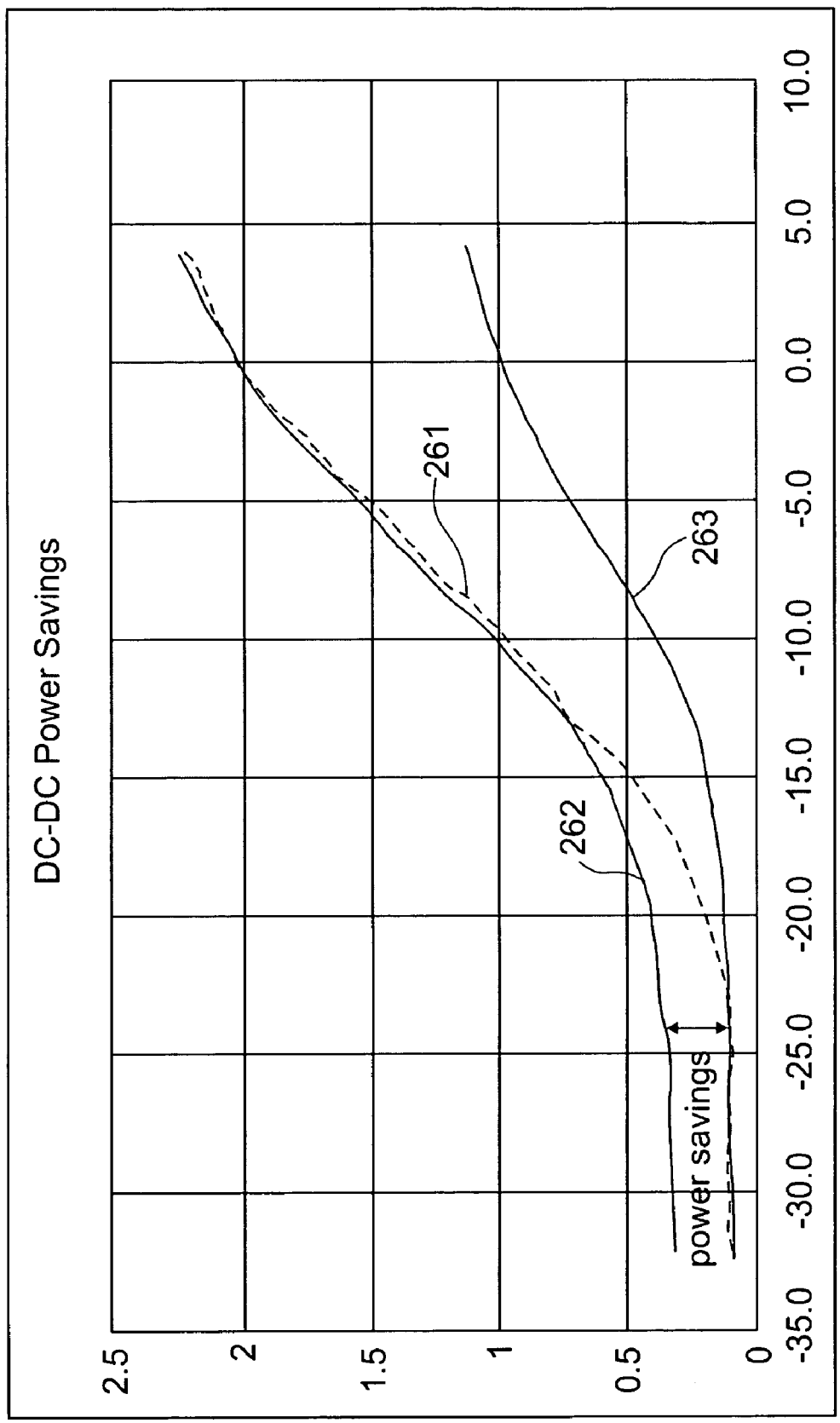
FIG. 2c illustrates a comparative graph of power consumption for the prior art power amplifier shown in FIG. 1 and for the PAIC shown in FIG. 2a; and, FIG. 3 illustrates a two-stage power amplifier integrated circuit (PAIC), which includes a low current DC to DC converter and automatic bias control, in accordance with a second embodiment of the invention.

As is shown in FIG. 2*c*, total power dissipation for the PAIC 200 is shown in trace 261, where the total power dissipation is a product of collector currents from transistors Q1 211 and Q2 212 times the potential of the converted output voltage plus the collector current of transistor Q3 213 times the potential difference between the first and second supply voltage ports, 200*e* and 200*f*. Collector currents for all three transistors, Q1 Q2 and Q3, are shown in trace 263. Power consumption for the prior art PAIC 100, is shown in trace 262. As is observed from this graph, for low input signal powers, because the first amplifying portion is essentially disabled, the second amplifying portion contributes to the power consumption for the PAIC 200. At approximately −20 dBm of input signal power, the first amplifying portion is enabled for operation and thus the power consumption increases. As compared to the prior art, because all amplifying portions are enabled, the power consumption is higher, as shown in the graph of FIG. 2*c*.

A limiting, and approximately maximum, level of RF output signal power is attained when the DC to DC converter is providing its first and second converted output voltages at approximately a maximum potential and thus provides an approximately maximal converted output voltage to the collector terminals of transistors Q1 211 and Q2 212. Additionally, transistor Q3 213 is biased such that this transistor is fully turned on to utilize the power supply potential from the first supply voltage port 200e, which has the battery connected thereto. Advantageously, the PAIC 200 is designed such that amplification is achieved to overlap DC to DC converter operation and transistor Q3 213 base terminal biasing.

Figure 3:
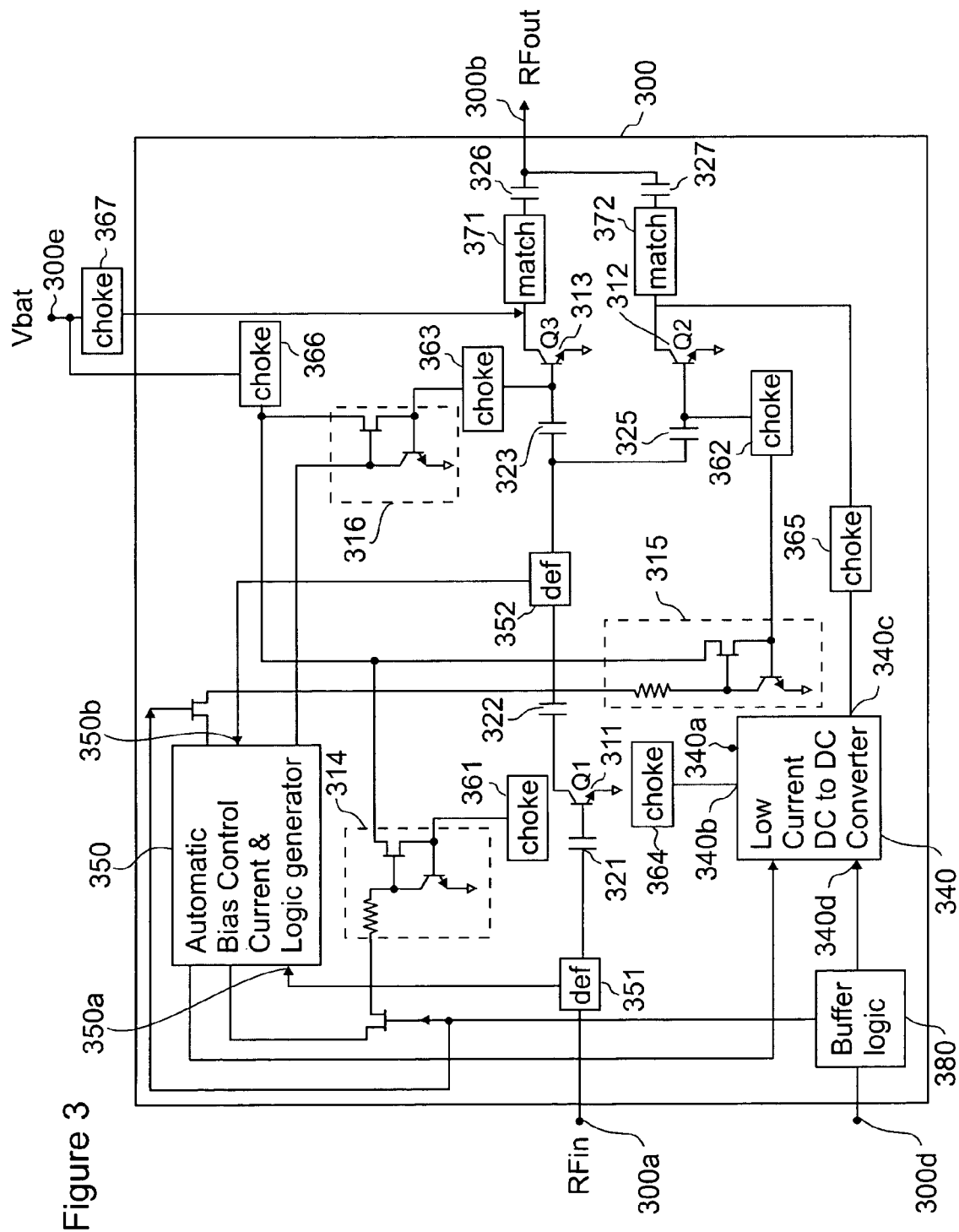

FIG. 3 illustrates a two-stage power amplifier integrated circuit (PAIC) 300, which includes a low current DC-to-DC converter 340 and an automatic bias control circuit 350, in accordance with a second embodiment of the invention. An input stage of the two-stage amplifier circuit is comprised of a first transistor Q1 311. An output amplification stage of the PAIC 300 having an output stage amplification is comprised of a first amplifying portion having a first amplification and including a third transistor Q3 313 and a second amplifying portion having a second amplification and including a second transistor Q2 312. The first amplification and the second amplification together form the output stage amplification.

A RF input port 300a of the PAIC 300 is coupled using a capacitor to a first RF power detector 351, which is further capacitively coupled using capacitor 321 to the base terminal of transistor Q1 311. The collector terminal of transistor Q1 311 is coupled to a coupling capacitor 322, which is further coupled to a second RF power detector 352. The second RF power detector 352 is coupled with a coupling capacitor 323 to the base terminal of transistor Q3 313 and with a coupling capacitor 325 to the base terminal of transistor Q2 312.

Transistor Q2 312 has its collector terminal coupled in series with a first impedance-transforming network 372 and a coupling capacitor 327 to the output port 300b. The collector terminal of transistor Q3 313 is coupled in series with a second network 371 and a coupling capacitor 326 to the output port 300b. A choke 367 is used for coupling of the collector terminal of transistor Q3 313 to the first supply voltage port 300e.

First and second supply voltage ports, 300e and 300f, are used to supply positive and ground potentials from a voltage supply source, preferably in the form of a battery, to the PAIC 300. The second supply voltage port 300f is grounded and the first supply voltage port 300e is provided with a positive supply voltage. The low current DC to DC converter 340 is also disposed between the first and second supply voltage ports, 300e and 300f, having its positive voltage input ports, 340a coupled with the first supply voltage port 300e. An enable port 300d is also provided as part of the DC to DC converter 340 for enabling and disabling operation thereof. A first converted voltage output port 340b is coupled using a choke 364 to the collector terminal of transistor Q1 311. A second converted voltage output port 340c is coupled using a choke 365 to the collector terminal of transistor Q2 312. The first and second converted voltage output ports, 340b and 340c, provide first and second converted output voltages therefrom.

A first bias voltage source 314 is coupled to the base terminal of transistor Q1 311 using a choke 361, a second bias voltage source 315 is coupled to the base terminal of transistor Q2 312 using a choke 362 and a third bias voltage source 316 is coupled to the base terminal of transistor Q3 313 using a choke 363. Another choke 366 disposed between the first supply voltage port 300e is used for coupling of the positive supply voltage to the bias circuits, 314, 315 and 316.

An automatic bias control circuit 350 is provided with first and second input ports, 350a and 350b, coupled with first and second RF power detectors, 351 and 352, for receiving of first and second detected power signals therefrom. Furthermore, the automatic bias control circuit 350 is provided with three output ports, which are respectively coupled with the first, second, and third bias voltage sources, 314, 315 and 316. In receiving of the first and second detected power signals the automatic bias control circuit 350 provides first, second and third internal control signals to the first, second, and third bias voltage sources, 314, 315 and 316 for controlling the biasing of transistors Q1 311, Q2 312 and Q3 313. A buffer logic circuit 380 is disposed between the control port 300d and a DC to DC converter control port 240d and switching circuitry for enabling of the operation of the first and second bias circuits, 314 and 315, as well as the automatic bias control circuit 350.

The operation of the PAIC 300 is similar to that of the PAIC 200. However, in this case, the automatic bias control circuit 350 is used for providing of the control signals to the circuitry within the PAIC 300 for automatic biasing of the amplifying stages therein. Graphs depicted in FIGS. 2b and 2c are similarly applicable to the operation of the PAIC 300. For low RF output signal power levels, transistors Q1 311 and Q2 312 have nominal bias conditions sufficient to maintain linearity up to a predetermined RF output signal power level, which is usually no more than $\frac{1}{6}^{th}$ to $\frac{1}{4}^{th}$ of the total RF output signal power for the PAIC 300. Power detectors, 351 and 352, are used to detect the RF signal power level within the PAIC 300. Since the collector terminals of transistors Q1 311 and Q2 312 are couple to the converted voltage output ports, 340b and 340c, of the DC to DC converter 340, as first and second converted output voltages of the DC to DC converter 340 increase, the RF output signal power level provided from the output port 300b increases. This increase in the RF output signal power level is attributed to the first and second converted output voltages increasing as a result of the automatic bias control circuit 350 controlling of the first, second and third bias circuits, 314, 315 and 316, as well as the DC to DC converter 340.

At low RF output signal power levels, transistor Q3 313 has a low bias voltage in order to reduce its power consumption. Thus, virtually all of the amplification in the RF output signal is attributed to the amplification from transistor Q2 312. In this mode of operation, total power dissipation for the PAIC 300 is a product of collector currents from transistors Q1 311 and Q2 312 times the DC to DC converted supply voltage plus the collector current of transistor Q3 313 times the potential difference between the first and second supply voltage ports, 300e and 300f.

The automatic bias control circuit 350 controls the bias voltage of transistor Q3 313 to be as low as possible up to mid level RF output signal power levels, while the converted output voltage continues to rise via an internal control signal received for the automatic bias control circuit 350.

For an increased RF output signal power level for the PAIC 300, additional amplification is performed by transistor Q3 313 in order for the PAIC 300 to operate at full RF output signal power and linearity. At this point, the RF output signal from transistor Q3 313 is summed with the saturated RF output signal of the smaller transistor Q2 312.

A limiting level of RF output signal power is attained when the DC to DC converter 340 provides its converted output voltage at an approximately maximum potential and thus provides an approximately maximal converted output voltage to the collector terminals of transistors Q1 311 and Q2 312. Additionally, transistor Q3 313 is biased such that this transistor is fully turned on to utilize the fixed power supply voltage from the supply voltage ports, 300*e* and 300*f*. Advantageously, the PAIC 300 is designed such that efficient amplification is provided to overlap operation of the DC to DC converter 350 and transistor Q3 313 base terminal biasing, as determined by the automatic bias control circuit 350 in response to received first and second detected signals from the first and second power detector circuits, 351 and 352.

Therefore, as the converted output voltage increases, the linearity for any level of drive power increases, up to predetermined limits. In use, the increase in RF output signal power is attributed to increases in RF input signal power as detected by the first and second RF power detectors 351 and 352. The automatic bias control circuit 350 provides an increasing voltage to the DC to DC converter, which produces a commensurate increase in its converted output voltage. The increased converted output voltage provides linear operation to a predetermined "switch" point, similar to switch point 251*b* (FIG. 2*b*), where transistor Q3 313 begins to operate and supplement the RF output signal power. This provides the overlap of DC to DC converter operation for the PAIC 300.

Advantageously, the embodiments of the invention reduce power dissipation by reducing the collector terminal supply voltage that is provided to transistors Q1, 211 and 311, and Q2, 212 and 312, for low RF output signal power levels. Power dissipation of transistor Q3, 213 and 313, is reduced at low RF signal power levels and is varied as RF output signal power level increases by adjustment of biasing circuitry for biasing thereof. Further advantageously, the embodiments of the invention reduce amplification and phase discontinuities as RF output signal power increases, while DC to DC converter size and current consumption thereof is also reduced during operation of the PAIC. Because the DC to DC converted is coupled to the second amplifying portion that is smaller than the third amplifying portion, it facilitates integration on the same semiconductor die as that of the rest of the components forming the PAIC 200 and 300. Furthermore, the second embodiment of the invention provides automatic biasing of transistors within the PAIC and thus obviates provision of an external bias control signal from an external bias control circuit.

Numerous other embodiments may be envisaged without departing from the spirit or scope of the invention.

What is claimed is:

1. A power amplifier (PA) circuit comprising:
    a PA output stage having a first amplifying portion having a first amplification and disposed in parallel with a second amplifying portion having a second amplification portion, the PA output stage having an output stage input port for receiving of a RF input signal, an output stage output port for providing of an amplified RF signal, and an output stage amplification being the amplification from the output stage input port to the output stage output port;
    at least a biasing circuit for biasing of at least one of the first amplifying portion and the second amplifying portion;
    a DC to DC converter circuit coupled with the second amplifying portion for providing of a second converted output voltage to the second amplifying portion;
    a first control port coupled with the DC to DC converter and for receiving a first control signal to control the DC to DC converter second converted output voltage in dependence upon a predetermined signal strength of the amplified RF signal at the output stage output port; and,
    a second control port coupled with the at least a biasing circuit and for receiving a second control signal to control the at least a biasing circuit in such a manner that a ratio of RF input signal amplification between the first amplification and the second amplification varies in dependence upon the predetermined signal strength at the output stage output port.

2. A PA circuit according to claim 1 comprising:
    a second RF power detector for detecting a signal power of the RF input signal and for providing a second detected signal based on the detected signal power; and,
    an automatic bias control circuit coupled with the second detector circuit for receiving of the second detected signal therefrom and coupled to the at least a biasing circuit for adjusting the ratio of RF input signal amplification between the first amplifying portion and the second amplifying portion.

3. A PA circuit according to claim 2 wherein the at least a biasing circuit comprises:
    a first biasing circuit for biasing of the first amplifying portion; and
    a second biasing circuit different from the first biasing circuit for biasing of the second amplifying portion.

4. A PA circuit according to claim 2 comprising:
    an input amplification stage having an input amplification and an input port for receiving of the RF input signal and an output port for providing of the amplified version of the RF input signal to the input port of the output amplification stage, the input amplification stage comprising:
    a first amplification stage; and,
    a first RF power detector circuit coupled with the input port of the input amplification stage for detecting a signal power of the RF input signal for providing a first detected signal to the automatic bias control circuit in dependence upon the detected signal power,
    wherein the DC to DC converter circuit is coupled with the first amplification stage for providing a first converted output voltage to the first amplification stage.

5. A PA circuit according to claim 1 comprising:
    a semiconductor die, wherein the DC to DC converter is integrated with the power amplifier circuit on the semiconductor die.

6. A PA circuit according to claim 1 wherein the first amplifying portion comprises a third transistor and the second amplifying portion comprises a second transistor, wherein the third transistor is approximately 2 to 10 times larger than the size of the second transistor.

7. A PA circuit according to claim 1 wherein the second amplifying portion comprises a second bipolar transistor having one of the emitter and collector terminals coupled with the DC to DC converter for receiving of the converted output voltage.

8. A PA circuit according to claim 1 wherein the first amplifying portion comprises a third bipolar transistor having one of the emitter and collector terminals coupled with the first supply voltage port and comprises other than a direct coupling with the DC to DC converter.

9. A method of controlling PA linearity and power consumption comprising:
    providing of a PA output stage having a first amplifying portion having a first amplification and a second amplifying portion having a second amplification that is greater than the first amplification, where the first amplification and the second amplification together form an output stage amplification;
providing of a DC to DC converted for providing a converted output voltage;
receiving of a RF input signal by the PA output stage;
determining whether a signal power of the RF input signal is one of below a threshold signal power level and above the threshold signal power level;
when the signal power of the RF input signal is below the threshold signal power level:
biasing of the first amplifying portion with a low bias voltage;
when the signal power of the RF input signal is above the threshold signal power level:
biasing of the first amplifying portion with a high bias voltage that is higher than the low bias voltage;
biasing of the second amplifying portion using the converted output voltage received from the DC to DC converter; and,
amplifying of the RF input signal to form a RF output signal that is an amplified version of the RF input signal.

10. A method according to claim 9 wherein when the first amplifying portion is biased with the low bias voltage it other than contributes first amplification to the output stage amplification.

11. A method according to claim 9 wherein when the first amplifying portion is biased at low bias voltage it does not significantly contribute to the power consumption of the PA output stage.

12. A method according to claim 9 comprising:
detecting a power of the RF input signal to determine whether the signal power of the RF input signal is one of below a threshold signal power level and above the threshold signal power level.

13. A method according to claim 12 wherein when the signal power of the RF input signal is above the threshold signal power level the second amplifying portion operates in a saturation mode of operation.

14. A method according to claim 9 comprising increasing a linearity of the output stage by increasing a second converted output voltage that is provided to the second amplifying portion.

15. A method according to claim 9 comprising:
determining a power consumption of the PA output stage in order to determine the threshold signal power level for reducing of the power consumption of the PA output stage.

16. A method according to claim 15 comprising:
varying of the threshold signal power level for reducing of the power consumption of the PA output stage.

17. A method according to claim 9 comprising:
receiving of a first amplified signal from the first amplifying portion having the first amplification;
receiving of a second amplified signal from the second amplifying portion having the second amplification; and,
summing the first and second amplified signals to form the output signal having the output stage amplification.

18. A method according to claim 9 comprising:
other than providing of the converted output voltage to the first amplifying portion.

19. A power amplifier (PA) comprising:
a PA output stage having a first amplifying portion having a first amplification and disposed in parallel with a second amplifying portion having a second amplification, the PA output stage having an output stage input port for receiving of a RF input signal, an output stage output port for providing of an amplified RF signal, and an output stage amplification being the amplification of the RF input signal from the output stage input port to the output stage output port;
a DC to DC converter circuit comprising a first control port for receiving a first control signal for controlling the DC to DC converter for providing of a second converted output voltage to the second amplifying portion in dependence upon a predetermined signal strength of the amplified RF signal at the output stage output port; and,
at least a biasing circuit for biasing the first amplifying portion in dependence upon the first control signal for amplifying the RF input signal such that for the output stage amplification a ratio between the first amplification and the second amplification varies in dependence upon the first control signal.

20. A PA according to claim 19 wherein the at least a biasing circuit comprises:
a first biasing circuit for biasing of the first amplifying portion; and,
a second biasing circuit different from the first biasing circuit for biasing of the second amplifying portion.

21. A power amplifier circuit according to claim 20 comprising:
an input amplification stage having an input amplification and an input port for receiving of the RF input signal and an output port for providing of the amplified version of the RF input signal to the input port of the output amplification stage, the input amplification stage comprising:
a first amplification stage, wherein the DC to DC converter circuit is for providing a first converted output voltage to the first amplification stage.

22. A PA according to claim 19 comprising:
a same semiconductor substrate, wherein the DC to DC converted is integrated with the PA output stage on the same semiconductor substrate.

23. A PA according to claim 19 wherein the first amplifying portion comprises a third transistor and the second amplifying portion comprises a second transistor, wherein the third transistor is approximately 2 to 10 times the size of the second transistor.

* * * * *